United States Patent
Oda et al.

(10) Patent No.: US 8,157,973 B2
(45) Date of Patent: Apr. 17, 2012

(54) SPUTTERING TARGET/BACKING PLATE BONDED BODY

(75) Inventors: Kunihiro Oda, Ibaraki (JP); Atsushi Fukushima, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 683 days.

(21) Appl. No.: 12/306,734

(22) PCT Filed: May 2, 2007

(86) PCT No.: PCT/JP2007/059359
§ 371 (c)(1),
(2), (4) Date: Dec. 29, 2008

(87) PCT Pub. No.: WO2008/001547
PCT Pub. Date: Jan. 3, 2008

(65) Prior Publication Data
US 2009/0277788 A1    Nov. 12, 2009

(30) Foreign Application Priority Data
Jun. 29, 2006   (JP) .................................. 2006-179930

(51) Int. Cl.
 C23C 14/34   (2006.01)
 C23C 14/35   (2006.01)
(52) U.S. Cl. ............... 204/298.13; 204/298.12; 228/193
(58) Field of Classification Search .................. None
 See application file for complete search history.

(56) References Cited

U.S. PATENT DOCUMENTS

| | | |
|---|---|---|
| 5,244,556 A | 9/1993 | Inoue |
| 5,693,203 A | 12/1997 | Ohhashi et al. |
| 6,709,557 B1 * | 3/2004 | Kailasam et al. ........ 204/298.13 |
| 6,759,143 B2 | 7/2004 | Oda et al. |
| 6,793,124 B1 | 9/2004 | Takahashi et al. |
| 6,858,116 B2 | 2/2005 | Okabe et al. |
| 6,875,325 B2 | 4/2005 | Miyashita et al. |
| 7,115,193 B2 | 10/2006 | Takahashi |
| 7,347,353 B2 | 3/2008 | Yamakoshi et al. |
| 2005/0161322 A1 * | 7/2005 | Smathers ................. 204/298.12 |
| 2007/0051624 A1 | 3/2007 | Okabe et al. |
| 2007/0125646 A1 * | 6/2007 | Young et al. ............. 204/298.12 |
| 2008/0116066 A1 | 5/2008 | Miyashita |

(Continued)

FOREIGN PATENT DOCUMENTS

JP     11189870 A  *  7/1999

(Continued)

OTHER PUBLICATIONS

Machine translation of Saida, J., JP 11-189870, Jul. 13, 1997.*

(Continued)

*Primary Examiner* — Krishnan S Menon
*Assistant Examiner* — Michelle Adams
(74) *Attorney, Agent, or Firm* — Howson & Howson LLP

(57) ABSTRACT

Provided is a sputtering target/backing plate assembly having a structure such that pure copper is embedded in a backing plate position at the central portion of the target, within sputtering target/copper-zinc alloy backing plate bonded bodies. Consequently, provided is a simple structure of sputtering target/backing plate capable of sufficiently accommodating further high-power sputtering without deteriorating the characteristics of a copper-zinc alloy backing plate that is inexpensive and excels in strength and anti-eddy current characteristics.

17 Claims, 1 Drawing Sheet

U.S. PATENT DOCUMENTS

2008/0236738 A1* 10/2008 Lo et al. .................. 156/283
2009/0008245 A1  1/2009 Yamakoshi et al.
2009/0032392 A1  2/2009 Miyashita
2009/0134021 A1  5/2009 Oda et al.

FOREIGN PATENT DOCUMENTS

WO  WO-2005/007920 A2 *  1/2005
WO  WO-2006/054409 A1 *  5/2006

OTHER PUBLICATIONS

One Page English Language Abstract of JP 63-045368, Feb. 26, 1988.
One Page English Language Abstract of JP 01-222047, Sep. 5, 1989.
One Page English Language Abstract of JP 08-269704, Oct. 15, 1996.
One Page English Language Abstract of JP 2001-329362, Nov. 27, 2001.
One Page English Language Abstract of JP 11-189870, Jul. 13, 1999.

* cited by examiner

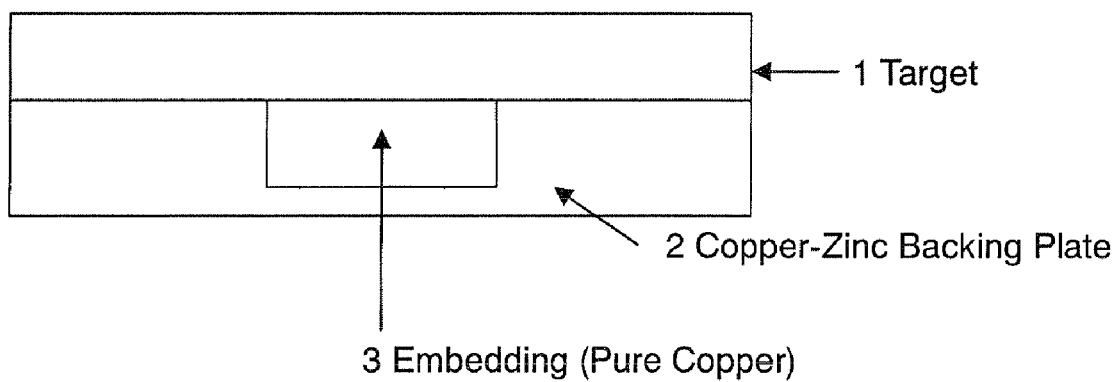

SPUTTERING TARGET/BACKING PLATE BONDED BODY

BACKGROUND OF THE INVENTION

The present invention relates to a simple structure of sputtering target/backing plate capable of sufficiently accommodating further high-power sputtering without deteriorating the characteristics of a copper-zinc alloy backing plate that is inexpensive and excels in strength and anti-eddy current characteristics.

In recent years, copper alloy with favorable thermal conductivity is generally used as the cooling/support substrate of a sputtering target. For instance, Patent Document 1 describes that brass, aluminum bronze and work-strengthened pure copper do not get scratched easily and possess sufficient strength and thermal conductivity in comparison to the conventionally used pure copper (oxygen-free copper), aluminum (aluminum alloy) and stainless steel.

Moreover, Patent Document 2 describes copper alloy containing 0.5 to 2 wt % of chromium, in particular JIS Z3234 (containing 1 wt % of chromium) as a representative example of the material of a chromium-copper backing plate.

In addition, Patent Document 3 describes that a copper alloy or an aluminum alloy backing plate having a specific resistance value of 3.0 $\mu\Omega \cdot cm$ or greater and tensile strength of 150 MPa or greater is effective for reducing, as much as possible, the eddy current that arises from the rotation of the magnet during magnetron sputtering and inhibiting the variation in the rotation speed of the magnet, and thereby inhibiting the variation in the effective flux, improving the uniformity of the film, increasing the deposition speed, and improving the productivity.

The Examples of Patent Document 3 describe diffusion bonding of a high-purity Cu target (6N) and brass having a specific resistance of 7.2 $\mu\Omega \cdot cm$ and tensile strength of 320 MPa to prepare a sputtering target-backing plate assembly with a total thickness of 17 mm.

Patent Document 4 describes that it is effective to insert an aluminum or aluminum alloy plate having a thickness of 0.5 mm or greater in a tantalum or tungsten target-copper alloy backing plate assembly with minimal deformation after the diffusion bonding, without debonding or cracks between the target and backing plate, and capable of withstanding high-power sputtering. In the Examples, copper-chromium alloy and copper-zinc alloy are used for the copper alloy backing plate.

Patent Document 5 describes a copper or copper alloy target/copper alloy backing plate capable of favorably balancing the anti-eddy current characteristics in the copper or copper alloy sputtering target and the characteristics required in the other magnetron sputtering targets. Patent Document 5 additionally describes that a low-beryllium copper alloy or Cu—Ni—Si based copper alloy backing plate is suitable for the copper alloy backing plate, and further requires a conductivity of 35 to 60% (IACS), and a 0.2% yield strength of 400 to 850 MPa.

Moreover, as a method of resolving problems caused by the heat generated from the target, proposed is a target/backing plate assembly in which a target and a backing plate with higher thermal conductivity than the target are integrated directly, or by the explosive bonding method, hot rolling method and the like via a spacer having a higher melting point than the target (refer to Patent Document 6).

In the case of the Al alloy target, pure silver, titanium, nickel and the like are listed as the spacer. Patent Document 6 describes that it is possible to speed up the deposition and increase the temperature of the target, and therefore possible to stably form high-quality thin films.

Moreover, Patent Document 7 describes that it effectuates the cooling efficiency of the target by inserting copper or aluminum or the alloy thereof between the target and the backing plate (backing plate material is Cu, Al, Cu93-Al17, or Cu4-Al96).

Here, Patent Document 7 describes that this is effective against such problems caused by uneven cooling as structural change due to the recrystallization of the target material, deformation (warping) due to the thermal stress of the target material, deterioration in the sputtering efficiency, and meltdown of the target. It is described that, preferably, the insert is of an area that is 70% of the target or greater and the thickness is roughly 0.05 to 0.5 mm.

In addition, Patent Document 8 describes a sputtering device characterized in that a reaction preventer for preventing the reaction between the target and the backing plate is provided at least on the front face of the backing plate right under the erosion or on the back face of the target. Patent Document 8 further describes that the reaction preventer should be high-melting-point metals or any their nitrides, silicides, carbides or borides, or the graphite layer embedded in the groove, or a hollow.

Patent Document 8 describes that it is possible to prevent situations where the target cannot be removed from the backing plate due to the reaction with the heat from sputtering when replacing the target, and where the contamination results from diffusion of copper consisted in the backing plate into the target and intrusion thereof into the formed thin film as impurities.

[Patent Document 1] Japanese Patent Laid-Open Publication No. H1-222047
[Patent Document 2] Japanese Patent Laid-Open Publication No. H8-269704
[Patent Document 3] Japanese Patent Laid-Open Publication No. 2001-329362
[Patent Document 4] Japanese Patent Laid-Open Publication No. 2002-129316
[Patent Document 5] WO2005/064036
[Patent Document 6] Japanese Patent Laid-Open Publication No. H4-131374
[Patent Document 7] Japanese Patent Laid-Open Publication No. H11-189870
[Patent Document 8] Japanese Patent Laid-Open Publication No. S63-45368

The foregoing background art was obtained from patent gazettes, but as recent technology the linearity of sputtered particles to be deposed on the wafer is controlled by increasing the sputtering power and improving the ionization efficiency of the sputtered particles in order to form a fine wiring network of 90 nm to 65 nm process or the like.

For example, this kind of sputtering process is referred to as the self ionized process. Depending on the status of the magnetic field that arises due to the magnetron rotating at the rear of the backing plate in the sputtering device, there are cases where the heat generated in the severely eroded area of the target becomes extremely high.

Generally speaking, copper-zinc alloy is used as the backing plate material, since it can be manufactured inexpensively, has high strength and superior thermal conductivity, and is able to inhibit the generation of the eddy current. Nevertheless, even when this kind of effective copper-zinc alloy is used for the backing plate, an additional problem has arisen in that zinc, an additive alloy element, evaporates at the portion where the erosion is concentrated and debonding occurs at the diffusion bonded interface.

In particular, this kind of problem has frequently occurred with a tantalum or tantalum-based alloy target having low thermal conductivity. Since the heat dissipation lines were cut off at the portion debonded from the backing plate, when sputtering was continued while neglecting this status, the target was partially melted down due to the heat accumulation and there were cases that sputtering could not be continued.

With the other targets (for instance, copper-0.5% aluminum alloy target), since the thermal conductivity of the target itself is significantly higher than the thermal conductivity of tantalum, a meltdown would not occur. Nevertheless, trace amounts of zinc were detected in the sputtering atmosphere.

The reason why zinc transpires is because the vapor pressure is high, and even from hypothetical numerical calculation results, it has been discovered that problems arise when the highest temperature of the backing plate at the bonded interface right under the most eroded position exceeds roughly 500° C.

SUMMARY OF THE INVENTION

In light of the foregoing conventional problems, an object of the present invention is to provide a simple structure of sputtering target/backing plate capable of sufficiently accommodating further high-power sputtering without deteriorating the characteristics of a copper-zinc alloy backing plate that is inexpensive and excels in strength and anti-eddy current characteristics.

In order to overcome the problem caused by the heat generated from the target, by inserting an insert material with thermal conductivity that is more favorable than the copper-zinc alloy between the target and the copper-zinc alloy backing plate, it is possible to analogize that the heat generated from the target is dissipated to the backing plate side, and the temperature of the copper-zinc alloy backing plate can be lowered to a temperature in which zinc does not transpire.

Nevertheless, if the thickness of the insert material is thin, it is not possible to lower the temperature of the backing plate to a temperature in which zinc does not transpire, and contrarily, if the insert material is too thick, the backing plate thickness becomes thin by just that much and this is not preferable since the backing plate strength deteriorates.

For example, if tantalum was used for the target and a pure copper insert material with a thickness of 5 mm and having the same area as the target was inserted, the debonding of the target due to the transpiration of zinc did not occur, but there was fluctuation in the magnet rotation due to the influence from the eddy current that arose at the insert portion. Since the insert material had the same area as the target, influence from the eddy current was significant, and the simple use of an insert cannot overcome the foregoing problems.

As a result of intense study to overcome these problems, it has been discovered that it is necessary to produce a backing plate having a structure, in which such a material to be diffusion bonded to the copper-zinc alloy as has more preferable thermal conductivity than copper-zinc alloy and does not contain high vapor pressure elements, is embedded only at the area, where precipitous erosion occurs, in order to release the heat efficiently toward the backing plate side. It has also been discovered that pure copper is optimal as this material since it needs to be diffusion bonded to the target and the copper-zinc alloy backing plate.

Moreover, with magnetron sputtering, the magnetron is rotating behind the backing plate, and the eddy current inhibits the variation of magnetic field and occurs greater at the outer periphery in which the fluctuating speed of magnetic field is faster. This eddy current occurs frequently with materials having low electrical resistance, and deteriorates the uniformity of the film by causing the magnetron rotation to fluctuate.

Thus, it has been discovered that it is necessary to embed pure copper at the central portion of the target in order to reduce the influence of the eddy current of the pure copper embedding.

Based on the foregoing discovery, the present invention provides 1) a sputtering target/backing plate assembly having a structure such that pure copper is embedded in a backing plate position at the central portion of the target, within sputtering target/copper-zinc alloy backing plate bonded bodies.

The present invention is able to prevent the temperature rise, evaporation of zinc contained in the copper-zinc alloy backing plate, and the debonding between the target/backing plate, which primarily occur during the sputtering with the sputtering target/copper-zinc alloy backing plate bonded body. At the same time, however, it is also necessary to inhibit the generation of the eddy current that causes the deterioration in the uniformity of the film.

As described above, since the eddy current inhibits the variation of magnetic field and occurs greater at the outer periphery in which the fluctuating speed of magnetic field is faster, copper-zinc alloy capable of inhibiting the generation of the eddy current needs to be used for the outer periphery of the backing plate. Thus, it is necessary to replace only the central portion of the target where the energy is concentrated with pure copper which does not contain zinc and has high thermal conductivity.

Since there are differences in the temperature rise and bond strength with the backing plate depending on the target material, the measurement of the thickness and diameter at the center portion formed from pure copper needs to be set appropriately according to the target material. However, there is a suitable value that can be broadly applied in the sputtering target/copper-zinc alloy backing plate bonded body. Specifically, this would be 2) a sputtering target/backing plate assembly in which the diameter of the embedding formed from pure copper is $1/20$ to $1/2$ of the target diameter.

The smaller the diameter of the embedding formed from pure copper, the greater the strength, and the effect of inhibiting the generation of the eddy current increases. However, since the thermal conductivity deteriorates by just that much, it is desirable to make adjustments according to the target material and/or sputtering conditions.

Further, as a preferred mode of the embedded backing plate, there is 3) a sputtering target/backing plate assembly in which the thickness of the embedding formed from pure copper is $1/5$ to $4/5$ of the backing plate thickness.

Although the thickness of the pure copper embedding is not as directly influential as the diameter of the pure copper embedding, it still has a significant influence on the thermal conductivity.

Needless to say, the thicker the thickness of the embedding, the greater the heat removal effect of the target, and the debonding between the target/backing plate can be inhibited.

FIG. 1 shows the structure of the pure copper-embedded backing plate, and the pure copper as the embedding is taking on a shape of being enclosed by the copper-zinc alloy. This is just one example of the assembly. Although the strength of pure copper is lower in comparison to copper-zinc alloy, this kind of shape where the pure copper is enclosed by the copper-zinc alloy has a significant feature of comprising the function that enables to maintain the overall strength of the backing plate at high temperatures.

With the sputtering target/copper-zinc alloy backing plate assembly having the structure shown in FIG. 1, 4) the thickness of the pure copper embedding 3 is made to be ¼ to ¾ of the thickness of the copper-zinc alloy backing plate 2. And, this is a favorable structure since the heat removal effect of the target 1 is great and the debonding between the target/backing plate can be inhibited.

In relation to the structure of the sputtering target/backing plate assembly having an enclosing shape as described above, it is also possible to use 5) a sputtering target/backing plate assembly having a structure such that the thickness of the embedding formed from pure copper cuts through (penetrates) the thickness of the copper-zinc alloy backing plate. Here, cooling from the back face of the backing plate is direct cooling against the pure copper embedding. In this case, since the cooling medium and the pure copper with superior thermal conduction come in direct contact, it is possible to cool the central portion of the target more efficiently.

Although the sputtering target/backing plate assembly of the present invention can be applied regardless of the type of target material, it is effective in cases where 6) the target that is particularly heated to a high temperature is formed from tantalum or tantalum-based alloy. The present invention can also be applied to a sputtering target of high-melting-point metal materials as described above.

In addition, the present invention is effective for 7) a sputtering target/backing plate assembly having a structure such that the target and the backing plate are diffusion bonded. This kind of structure is based on a bonding method that is generally required for a high-melting-point target, and strong bonding is required because the thermal influence is extremely large. The present invention is also able to provide a sputtering target/backing plate assembly that is compatible therewith.

The sputtering target/backing plate assembly of the present invention is particularly useful in 8) a magnetron sputtering device in which the eddy current is generated easily. Nevertheless, it should be known that the sputtering target/backing plate assembly of the present invention does not have to be limited to the use in a magnetron sputtering device. In many cases, since the heat tends to concentrate at the central part of the target in comparison to the periphery thereof, the sputtering target/backing plate assembly of the present invention using pure copper with high thermal conductivity at the central part thereof is effective in order to seek the uniform cooling of the target. Thus, the present invention can also be applied to general sputtering devices.

As the pure copper as the embedding material to be used in the sputtering target/backing plate assembly of the present invention, 9) oxygen-free copper can be used as the pure copper.

The 10) copper-zinc alloy backing plate to be used in the sputtering target/backing plate assembly, wherein a copper-zinc based copper alloy containing 5 to 40 wt % of zinc can be used. This is because the copper-zinc alloy to be used as the backing plate material is inexpensive, has high strength and superior thermal conductivity, and is capable of inhibiting the generation of the eddy current.

According to the above, the present invention yields a superior effect of being able to provide a simple structure of sputtering target/backing plate capable of sufficiently accommodating further high-power sputtering without deteriorating the characteristics of a copper-zinc alloy backing plate that is inexpensive and excels in strength and anti-eddy current characteristics.

BRIEF DESCRIPTION OF DRAWING

FIG. 1 is an explanatory diagram of a cross section of a target/backing plate assembly according to the present invention.

DETAILED DESCRIPTION OF THE INVENTION

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.
(Heat Affect Test of Tantalum/Copper-Zinc Alloy Diffusion-Bonded Body)

The strength of a backing plate of the tantalum/copper-zinc alloy diffusion-bonded body can be confirmed by subjecting this to heat treatment and observing the evaporating status of zinc. The following materials were used as the target and backing plate.

Target: Tantalum, diameter of 440 mm, thickness of 4.8 mm

Copper-zinc alloy backing plate (alloy number C2600): Thickness of 17 mm

Bonding of target and copper-zinc alloy backing plate: Diffusion bonding

With this target/backing plate diffusion-bonded body, zinc did not transpire in the vacuum heating treatment up to 700° C. Nevertheless, in the vacuum heat treatment at 900° C., the diffusion bonded part of the tantalum/copper-zinc alloy as the copper-zinc alloy backing plate material started debonding.

Subsequently, in order to demonstrate this result in a numerical calculation, power of 500 W/cm$^2$ was uniformly applied to an area of the central portion having a diameter of 50 mm which was hypothetically the most eroded portion. (Total sputtering power of 10 kW. It was assumed that 10 kW would work intensively only at the area where the diameter is 50 mm. The actual sputtering power was 40 kW, and this is a case where debonding occurs.) Moreover, the back side (side opposite to the target) of the backing plate was water-cooled (cooling water temperature was 20° C.).

From the numerical calculation results, the highest temperature at the central portion of the surface of the tantalum target was 1040° C. This is close to the target temperature during actual sputtering.

When considering that the highest temperature of the bonded interface with the target was 770° C. at the central portion of the copper-zinc alloy backing plate and no problems arose at 700° C. of the vacuum heat treatment result, with the foregoing numerical calculation condition, since zinc begins to transpire when the temperature of the copper-zinc backing plate exceeds roughly 750° C., it is anticipated that the target/copper-zinc alloy backing plate starts debonding under these circumstances.

EXAMPLES

Based on the foregoing experiment and numerical calculation, various target/copper-zinc alloy backing plates embedded with pure copper were prepared, and the highest temperature of each copper-zinc alloy backing plate and the results of sputtering test were observed. The numerical calculation conditions were as follows.

Target: Tantalum, diameter of 440 mm, thickness of 4.8 mm

Copper-zinc alloy backing plate (alloy number C2600): Thickness of 17 mm

Embedding having a diameter of 50 mm and thickness of 6 mm was embedded at the most eroded central portion.

Power of 500 W/cm$^2$ was uniformly applied to the area of the most eroded central portion having a diameter of 50 mm, and the backing plate side was water-cooled (cooling water temperature was 20° C.).

The sputtering condition was that sputtering was performed toward the target/backing plate assembly having the foregoing shape at a sputtering power of 40 kW.

Examples 1 to 8 and Comparative Examples 1 and 2

With Examples 1 to 7, the diameter of the pure copper embedding was fixed to 50 mm as shown in Table 1, and the thickness was changed from 1 mm to 15 mm. With Example 8, the copper-zinc alloy backing plate adopted the cut-through (penetrated) structure.

Moreover, with Comparative Example 1, a pure copper insert of 1 mm was used between the target and the copper-zinc alloy backing plate, and with Comparative Example 2, a pure copper insert of 6 mm was used between the target and the copper-zinc alloy backing plate.

TABLE 1

| | Thickness of Pure Copper Embedding | Highest Temperature of Copper-Zinc Alloy Backing Plate | Sputtering Test Results |
|---|---|---|---|
| Example 1 | 1 mm | 710° C. | No debonding, acceptable deposition uniformity |
| Example 2 | 2 mm | 680° C. | No debonding, acceptable deposition uniformity |
| Example 3 | 3 mm | 630° C. | No debonding, favorable deposition uniformity |
| Example 4 | 6 mm | 510° C. | No debonding, superior deposition uniformity |
| Example 5 | 8 mm | 470° C. | No debonding, superior deposition uniformity |
| Example 6 | 12 mm | 360° C. | No debonding, favorable deposition uniformity |
| Example 7 | 15 mm | 320° C. | No debonding, acceptable deposition uniformity |
| Example 8 | 17 mm (cut through backing plate) | 270° C. | No debonding, acceptable deposition uniformity |
| Comparative Example 1 | 1 mm (inserted into entire surface of target) | Numerical calculation not performed | No debonding, inferior deposition uniformity |
| Comparative Example 2 | 6 mm (inserted into entire surface of target) | Numerical calculation not performed | No debonding, inferior deposition uniformity |

Diameter of Embedding: 50 mm;
Thickness of Copper-Zinc Alloy Backing Plate: 17 mm
Target: Tantalum;
Diameter: 440 mm;
Thickness: 4.8 mm (Sputtering Test Results)

From the numerical calculation, the highest temperature at the central portion of the tantalum target surface reached 1050° C., but the highest temperature of the copper-zinc alloy backing plate having the pure copper embedding with a thickness of 1 mm described in Example 1 was 710° C., debonding did not occur, and the deposition uniformity was acceptable.

As described above, merely by placing a thin pure copper embedding, the temperature of the copper-zinc alloy backing plate decreased, and it is evident that this is effective. If the pure copper embedding is not used as described above, the highest temperature of the bonded interface with the target was 770° C. at the central portion of the copper-zinc alloy backing plate. However, the temperature reduced to 710° C. and a temperature reduction of 60° C. became possible.

As shown in Table 1, just because the pure copper embedding is thin, it does not necessarily mean that the deposition uniformity is superior. This is considered to be because if the pure copper embedding is thin, the difference in temperature distribution of the target becomes great.

Examples 2 to 5

With Example 2, the highest temperature of the copper-zinc alloy backing plate having a pure copper embedding with a thickness of 2 mm was 680° C., debonding did not occur, and the deposition uniformity was acceptable.

With Example 3, the highest temperature of the copper-zinc alloy backing plate having a pure copper embedding with a thickness of 3 mm was 630° C., debonding did not occur, and the deposition uniformity was favorable.

With Example 4, the highest temperature of the copper-zinc alloy backing plate having a pure copper embedding with a thickness of 6 mm was 510° C., debonding did not occur, and the deposition uniformity was superior.

With Example 5, the highest temperature of the copper-zinc alloy backing plate having a pure copper embedding with a thickness of 8 mm was 470° C., debonding did not occur, and the deposition uniformity was superior.

As described above, along with the increase in the thickness of the pure copper embedding, the deposition uniformity improved, and the deposition uniformity was most superior when the thickness was 6 mm and 8 mm.

Examples 6 and 7

With Example 6, the highest temperature of the copper-zinc alloy backing plate having a pure copper embedding with a thickness of 12 mm was 360° C., debonding did not occur, and the deposition uniformity was favorable. In this case, even though the temperature decreased significantly, the deposition uniformity deteriorated slightly in comparison to the cases where the thickness of the pure copper embedding was 6 mm and 8 mm. This is considered to be because if the thickness is thick, as described above, there will be fluctuation in the magnet rotation caused by the eddy current.

With Example 7, the highest temperature of the copper-zinc alloy backing plate having a pure copper embedding with a thickness of 15 mm was 320° C., debonding did not occur, and the deposition uniformity was acceptable. In this case also, even though the temperature decreased significantly, the deposition uniformity deteriorated in comparison to the cases where the thickness of the pure copper embedding was 6 mm and 8 mm. This is considered to be because if the thickness is thick, the distance to the magnet will become close and, as described above, there will be fluctuation in the magnet rotation caused by the eddy current.

Example 8

Example 8 is a copper-zinc alloy backing plate having a pure copper embedding with a thickness of 17 mm, the same thickness as the copper-zinc alloy backing plate, and having a structure such that the embedding penetrates the backing plate. The highest temperature in this case was 270° C., debonding did not occur, and the deposition uniformity was acceptable. In this case, it is evident that the temperature decreased significantly and the cooling efficiency of the pure copper was favorable. Nevertheless, the deposition uniformity deteriorated in comparison to the cases where the thickness of the pure copper embedding was 6 mm and 8 mm. This is considered to be because if the thickness is thick, the distance to the magnet will become close and, as described above, there will be fluctuation in the magnet rotation caused by the eddy current.

Comparative Examples 1 and 2

As described above, with Comparative Example 1, a pure copper insert of 1 mm was used between the entire target face and the copper-zinc alloy backing plate, and with Comparative Example 2, a pure copper insert material of 6 mm was used between the entire target face and the copper-zinc alloy backing plate.

With Comparative Example 1 and Comparative Example 2, although debonding of the zinc alloy backing plate did not occur due to the insert effect of pure copper with high thermal conductivity, the deposition uniformity was inferior. This is considered to be because the inhibition effect of the copper-zinc alloy backing plate was diminished by the pure copper insert due to the fluctuation in the magnet rotation caused by the eddy current.

Examples 9 and 10

The test results upon fixing the thickness of the pure copper embedding to 6 mm, which was superior in the sputtering test results, and changing the diameter of the pure copper embedding are now shown in Table 2.

Conditions of the target and backing plate are the same as above (indicated again). This is shown as the ratio of the diameter of the pure copper embedding to the target diameter.

Target: Tantalum, diameter of 440 mm, thickness of 4.8 mm

Copper-zinc alloy backing plate (alloy number C2600): Thickness of 17 mm

Example 9 shows a case where the ratio of the pure copper embedding diameter to the target diameter is 1:2. The highest temperature of the copper-zinc alloy backing plate was 420° C., debonding did not occur, and the deposition uniformity was favorable.

Example 10 shows a case where the ratio of the pure copper embedding diameter to the target diameter is 1:5. The highest temperature of the copper-zinc alloy backing plate was 470° C., debonding did not occur, and the deposition uniformity was superior. The results are shown in Table 2.

TABLE 2

|  | Diameter Ratio of Pure Copper Embedding to Target | Highest Temperature of Copper-Zinc Alloy Backing Plate | Sputtering Test Results |
| --- | --- | --- | --- |
| Example 9 | 1/2 | 420°C. | No debonding, favorable deposition uniformity |
| Example 10 | 1/5 | 470°C. | No debonding, superior deposition uniformity |
| Example 11 | 1/7.5 | 500°C. | No debonding, superior deposition uniformity |
| Example 12 | 1/10 | 530°C. | No debonding, favorable deposition uniformity |
| Example 13 | 1/20 | 690°C. | No debonding, acceptable deposition uniformity |
| Comparative Example 3 | 1/1.5 | 400°C. | No debonding, inferior deposition uniformity |
| Comparative Example 4 | 1/30 | >750°C. | Partial meltdown of backing plate, debonding, sputtering interrupted |
| Comparative Example 5 | 1/40 | >750°C. | Partial meltdown of backing plate, debonding, sputtering interrupted |

Thickness of Pure Copper Embedding: 6 mm;
Thickness of Copper-Zinc Alloy Backing Plate: 17 mm
Target: Tantalum;
Diameter: 440 mm;
Thickness: 4.8 mm

Examples 11 to 13

Example 11 shows a case where the ratio of the pure copper embedding diameter to the target diameter is 1:7.5. The highest temperature of the copper-zinc alloy backing plate was 500° C., debonding did not occur, and the deposition uniformity was superior.

Example 12 shows a case where the ratio of the pure copper embedding diameter to the target diameter is 1:10. The highest temperature of the copper-zinc alloy backing plate was 530° C., debonding did not occur, and the deposition uniformity was favorable.

Example 13 shows a case where the ratio of the pure copper embedding diameter to the target diameter is 1:20. The highest temperature of the copper-zinc alloy backing plate was 690° C., debonding did not occur, and the deposition uniformity was acceptable.

Comparative Example 3

Comparative Example 3 shows a case where the ratio of the pure copper embedding diameter to the target diameter is 1:1.5. The highest temperature of the copper-zinc alloy backing plate is 400° C. and debonding did not occur, but the deposition uniformity was inferior. This is considered to be because the pure copper embedding diameter was too large and the deposition uniformity became inferior due to the fluctuation in the magnet rotation caused by the eddy current; that is, because the inhibition effect of the copper-zinc alloy backing plate was diminished by the pure copper insert.

Comparative Examples 4 and 5

Comparative Example 4 shows a case where the ratio of the pure copper embedding diameter to the target diameter is 1:30. The highest temperature of the copper-zinc alloy backing plate exceeded 750° C., and debonding occurred.

This is considered to be because the pure copper embedding diameter was too small, the thermal diffusion effect was insufficient, and the copper-zinc alloy backing plate was partially melted down.

Comparative Example 5 shows a case where the ratio of the pure copper embedding diameter to the target diameter is 1:40. The highest temperature of the copper-zinc alloy backing plate exceeded 750° C., and debonding occurred. The condition was aggravated even more than the condition in Comparative Example 4.

This is considered to be because the pure copper embedding diameter was too small, the thermal diffusion effect was insufficient, and the copper-zinc alloy backing plate was partially melted down.

As evident from the foregoing examples, if the proportion of the pure copper embedding diameter increases, the temperature of the copper-zinc alloy backing plate decreases, but the deposition uniformity does not improve significantly.

Meanwhile, if the proportion of the pure copper embedding diameter decreases, the temperature of the copper-zinc alloy backing plate increases, but the deposition uniformity becomes superior.

Nevertheless, if such proportion is extremely low, the effect of the pure copper embedding decreases, and the deposition uniformity also deteriorates. Accordingly, it is evident that the optimal conditions exist in all cases.

Specifically, it is desirable that the pure copper embedding diameter is $1/20$ to $1/2$ of the target diameter, and the thickness of the pure copper embedding is $1/5$ to $4/5$ of the backing plate thickness.

The present invention yields a superior effect of being able to provide a simple structure of sputtering target/backing plate capable of sufficiently accommodating further high-power sputtering without deteriorating the characteristics of a copper-zinc alloy backing plate that is inexpensive and excels in strength and anti-eddy current characteristics, and it is particularly effective when sputtering a target that is formed from high-melting-point target material such as tantalum or tantalum-based alloy.

The invention claimed is:

1. A sputtering target/backing plate assembly comprising:
   a sputtering target in a form of a disc-shaped plate of a predetermined diameter, the sputtering target having an exposed sputtering face and a rear face;
   a copper-zinc alloy backing plate of a predetermined thickness bonded to the rear face of the sputtering target; and
   a separate embedding of pure copper embedded between the copper-zinc alloy backing plate and the sputtering target, the embedding being in contact with a central portion of the rear face of the sputtering target, the embedding being a disc-shaped plate of a diameter that is less than the predetermined diameter of the sputtering target and being of a material different than that of the sputtering target.

2. The sputtering target/backing plate assembly according to claim 1, wherein the diameter of the embedding of pure copper is $1/20$ to $1/2$ of the predetermined diameter of the sputtering target.

3. The sputtering target/backing plate assembly according to claim 2, wherein the embedding of pure copper has a thickness that is $1/5$ to $4/5$ of the predetermined thickness of the copper-zinc alloy backing plate.

4. The sputtering target/backing plate assembly according to claim 3, wherein the thickness of the embedding of pure copper is $1/4$ to $2/4$ of the predetermined thickness of the copper-zinc alloy backing plate.

5. The sputtering target/backing plate assembly according to claim 4, wherein the target is formed from tantalum or tantalum-based alloy.

6. The sputtering target/backing plate assembly according to claim 5, wherein the sputtering target is diffusion bonded to the copper-zinc alloy backing plate.

7. The sputtering target/backing plate assembly according to claim 6, wherein the embedding of pure copper is made of oxygen-free copper.

8. The sputtering target/backing plate assembly according to claim 7, wherein the copper-zinc alloy backing plate is formed from copper-zinc based copper alloy containing 5 to 40 wt % of zinc.

9. The sputtering target/backing plate assembly according to claim 2, wherein the target is formed from tantalum or tantalum-based alloy.

10. The sputtering target/backing plate assembly according to claim 9, wherein the sputtering target is diffusion bonded to the copper-zinc alloy backing plate.

11. The sputtering target/backing plate assembly according to claim 10, wherein the copper-zinc alloy backing plate is formed from copper-zinc based copper alloy containing 5 to 40 wt % of zinc.

12. The sputtering target/backing plate assembly according to claim 1, wherein the embedding of pure copper has a thickness that is $1/5$ to $4/5$ of the predetermined thickness of the copper-zinc alloy backing plate.

13. The sputtering target/backing plate assembly according to claim 12, wherein the thickness of the embedding of pure copper is $1/4$ to $2/4$ of the predetermined thickness of the copper-zinc alloy backing plate.

14. The sputtering target/backing plate assembly according to claim 1, wherein the target is formed from tantalum or tantalum-based alloy.

15. The sputtering target/backing plate assembly according to claim 1, wherein the sputtering target is diffusion bonded to the copper-zinc alloy backing plate.

16. The sputtering target/backing plate assembly according to claim 1, wherein the embedding of pure copper is made of oxygen-free copper.

17. The sputtering target/backing plate assembly according to claim 1, wherein the copper-zinc alloy backing plate is formed from copper-zinc based copper alloy containing 5 to 40 wt % of zinc.

* * * * *